US 9,829,794 B2

(12) United States Patent
Saito

(10) Patent No.: US 9,829,794 B2
(45) Date of Patent: Nov. 28, 2017

(54) EXPOSURE APPARATUS, AND METHOD OF MANUFACTURING DEVICE

(71) Applicant: CANON KABUSHIKI KAISHA, Tokyo (JP)

(72) Inventor: Nobuyuki Saito, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/994,686

(22) Filed: Jan. 13, 2016

(65) Prior Publication Data

US 2016/0209763 A1    Jul. 21, 2016

(30) Foreign Application Priority Data

Jan. 16, 2015   (JP) ................. 2015-007122

(51) Int. Cl.
*G03B 27/42*   (2006.01)
*G03F 7/20*    (2006.01)

(52) U.S. Cl.
CPC ................. *G03F 7/2028* (2013.01)

(58) Field of Classification Search
CPC ............ G03F 7/70725; G03F 7/70775; G03F 7/70716; G03F 7/70758; G03F 7/70975; G03F 9/70; G03F 7/70733; G03F 7/7085; G03F 9/7088; G03F 7/70641; G03F 7/707; G03F 7/70358; G03F 7/70783; G03F 9/7026; G03F 7/70133; G03F 7/20; G03F 7/24; G03F 7/707
See application file for complete search history.

(56) References Cited

U.S. PATENT DOCUMENTS

| 8,842,278 | B2 | 9/2014 | Shibazaki |
| 9,001,304 | B2 | 4/2015 | Mueller et al. |
| 2006/0250594 | A1 | 11/2006 | Iwashita et al. |
| 2011/0026006 | A1* | 2/2011 | Shibazaki ........... G03F 7/70516 355/74 |

(Continued)

FOREIGN PATENT DOCUMENTS

| CN | 101339367 A | 1/2009 |
| CN | 101978323 A | 2/2011 |

(Continued)

OTHER PUBLICATIONS machine translation of JP,09-260263,A is attached.*

(Continued)

*Primary Examiner* — Mesfin Asfaw
(74) *Attorney, Agent, or Firm* — Rossi, Kimms & McDowell LLP

(57) ABSTRACT

An exposure apparatus exposes a peripheral portion of a substrate to light, and includes an optical system configured to irradiate the substrate with the light, a stage configured to hold the substrate and be moved in a direction to position the substrate in a direction perpendicular to the optical axis of the optical system, and a controller configured to cause the stage to be moved. The controller moves the stage based on information about a distance between the optical system and the peripheral portion in a direction parallel to the optical axis and a telecentricity of the optical system so that a predetermined portion of the substrate is irradiated with the light from the optical system.

20 Claims, 11 Drawing Sheets

(56) References Cited

U.S. PATENT DOCUMENTS

2013/0265559 A1* 10/2013 Saito .................. G03F 7/70133
  355/67
2013/0286373 A1* 10/2013 Kawanami .......... G03F 7/70258
  355/67

FOREIGN PATENT DOCUMENTS

| CN | 103295863 A | 9/2013 |
| CN | 204086811 U | 1/2015 |
| JP | 09260263 A | 10/1997 |
| TW | 417188 B | 1/2001 |
| TW | 201421167 A | 6/2014 |
| TW | M487460 U | 10/2014 |
| TW | 201447507 A | 12/2014 |
| WO | 2014008994 A1 | 1/2014 |

OTHER PUBLICATIONS

Office Action issued in Taiwanese Appln. No. 104144091, dated Oct. 20, 2016. English translation provided.
Office Action issued in Chinese Application No. 201610019083.8 dated Aug. 31, 2017. English translation provided.

\* cited by examiner

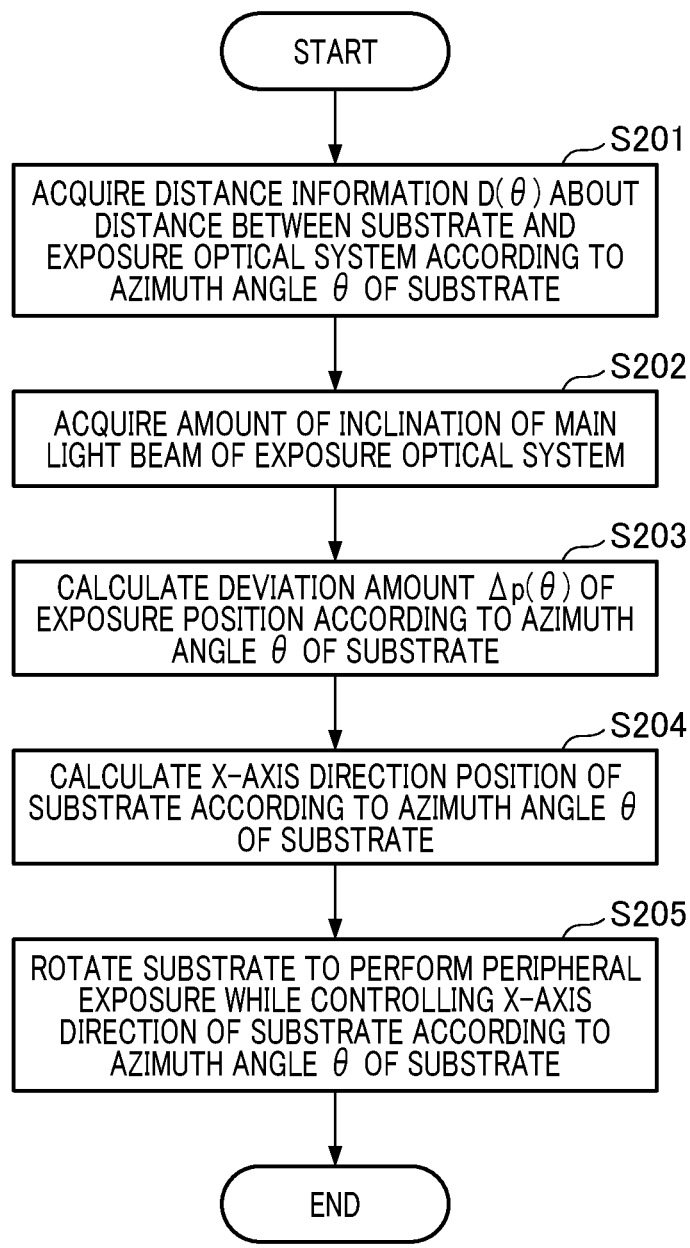

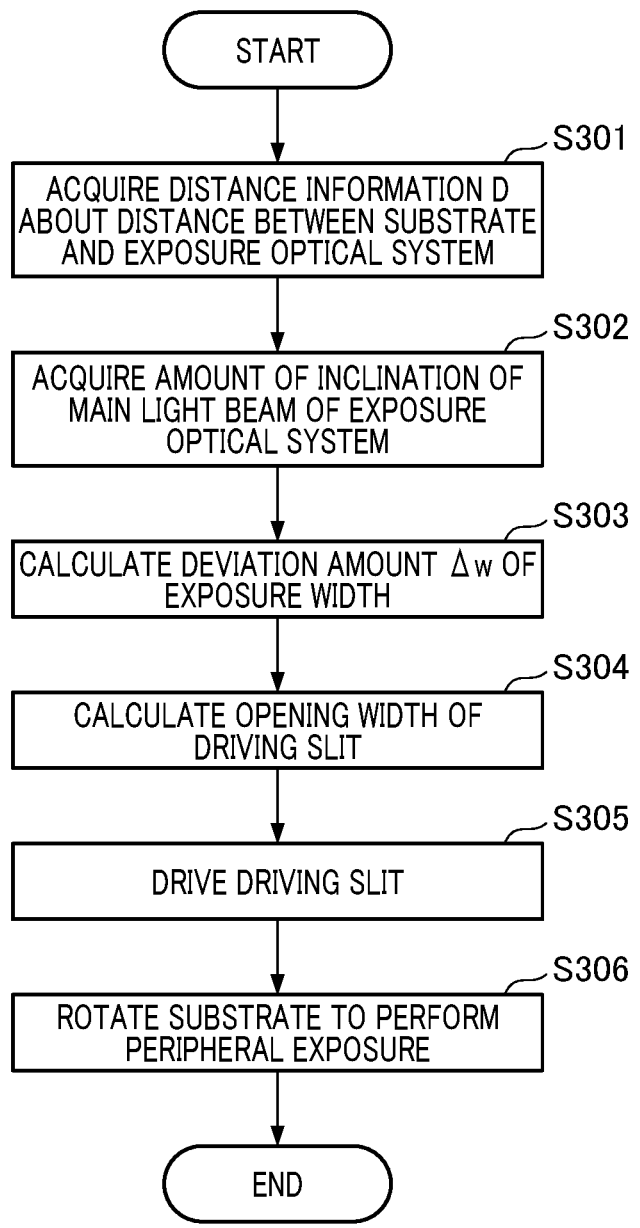

EXPOSURE APPARATUS, AND METHOD OF MANUFACTURING DEVICE

BACKGROUND OF THE INVENTION

Field of the Invention

The present invention relates to an exposure apparatus, and a method of manufacturing a device.

Description of the Related Art

In a lithography process for manufacturing semiconductor devices, when a resist (photosensitive agent) remains on a peripheral portion (a peripheral edge portion) of a substrate, the resist is peeled off, for example, during substrate transfer, which may cause a defect of the semiconductor devices. Thus, in order to obviate the peeling-off of the resist in advance, before the pattern exposure to the substrate, the resist of the peripheral portion of the substrate is exposed (peripheral exposure) using an exposure apparatus (a so-called peripheral exposure apparatus), and the resist is removed in a subsequent developing process. However, in some cases, due to an increase in a warp amount of the substrate caused by a lamination of the semiconductor device and an increase in the substrate size, the position of the substrate is defocused at the time of the peripheral exposure. Further, in the defocused state, since deviation occurs in the exposure position or the edge of the exposure region is blurred, it is not possible to accurately perform the peripheral exposure. Therefore, Japanese Patent Laid-Open No. 9-260263 discloses a peripheral exposure apparatus that performs focus adjustment by detecting a change in a relative distance between a peripheral exposure means and a resist coating surface of the substrate, and by performing the driving of the focusing direction of the peripheral exposure means based on the detected relative distance.

However, in the exposure apparatus disclosed in Japanese Patent Laid-Open No. 9-260263, since there is a need for a drive mechanism for moving the substrate in the focusing direction, the apparatus configuration is large and the apparatus cost increases.

SUMMARY OF THE INVENTION

The present invention provides, for example, an exposure apparatus that is advantageous in accuracy of a portion of a substrate exposed by peripheral exposure thereof to light.

The present invention has an exposure apparatus that exposes a peripheral portion of a substrate to light. The apparatus comprising: an optical system configured to irradiate the substrate with the light; a stage configured to hold the substrate and be moved in a direction to position the substrate in a direction perpendicular to an optical axis of the optical system; and a controller configured to cause the stage to be moved, wherein the controller is configured to cause the stage to be moved based on information about a distance between the optical system and the peripheral portion in a direction parallel to the optical axis and a telecentricity of the optical system so that a predetermined portion of the substrate is irradiated with the light from the optical system.

Further features of the present invention will become apparent from the following description of exemplary embodiments (with reference to the attached drawings).

BRIEF DESCRIPTION OF THE DRAWINGS

FIG. 5 is a flowchart illustrating the flow of the peripheral exposure in the second embodiment.

FIG. 8 is a flowchart illustrating the flow of the peripheral exposure in the third embodiment.

DESCRIPTION OF THE EMBODIMENTS

Hereinafter, modes for carrying out the present invention will be described with reference to the drawings.

First Embodiment

Figure 1:
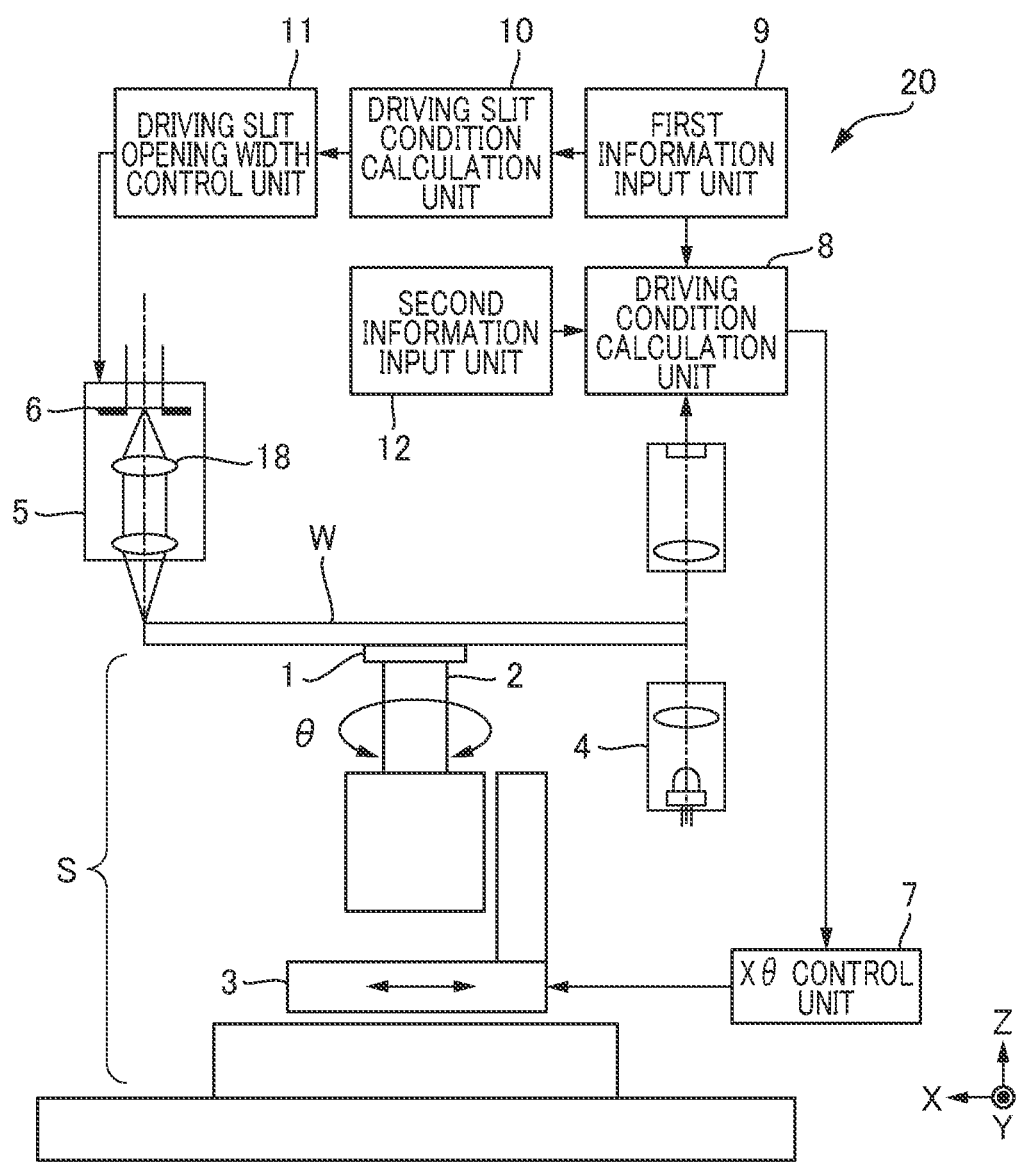
FIG. 1 is a diagram illustrating a configuration of an exposure apparatus according to a first embodiment.

First, an exposure apparatus according to a first embodiment of the present invention will be described. An exposure apparatus according to this embodiment is a so-called peripheral exposure apparatus that exposes, for example, a resist (photosensitive agent) adhering to a peripheral portion (a peripheral edge portion) of a substrate such as a wafer in a subsequent developing process, before the pattern exposure. FIG. 1 is a schematic cross-sectional view illustrating a configuration of an exposure apparatus 100 according to this embodiment. The exposure apparatus 100 has a stage S including a substrate holder 1, a rotary driving unit 2 and a translational driving unit 3, a detector 4, an exposure unit 5, and a control system 20. Further, in each drawing below FIG. 1, an X-axis and a Y-axis in a direction perpendicular to the X-axis are defined in a plane perpendicular to a Z-axis in a vertical direction. The substrate W is, for example, made of monocrystalline silicon, and is a substrate to be processed on which the resist is applied to the surface.

The substrate holder 1 holds a substantially central position of a rear surface of the substrate W. The rotary driving unit (rotary unit) 2 supports the substrate holder 1 and is rotatable. The translational driving unit 3 supports the rotary driving unit 2 and is, for example, movable in the X-axis direction, that is, allows the substrate holder 1 to move in the X-axis direction. The detector 4 detects the position of the peripheral portion of the substrate W held by the substrate holder 1, for example, a position of a notch or an orientation flat that is previously formed on the substrate W. The exposure unit 5 includes a light source (not illustrated), a driving slit 6 and an exposure optical system (an optical system) 18. The light source emits light (e.g., ultraviolet light) toward the exposure optical system 18. The driving slit (a member of a field stop) 6 has an opening through which light emitted from the light source passes to define an exposure region, and its opening shape (an opening width) is variable. The exposure optical system 18 irradiates (images) a predetermined position on the substrate W using the light passing through the opening of the driving slit 6 as the exposure light.

The control system (a controller) 20 performs the control of the operation of each element constituting the exposure apparatus 100 (the movement operation of the substrate holder 1, the driving operation of the driving slit 6 and the like), and the arithmetic operations for the operation, and includes an input unit and a control circuit as follows. Information about conditions of the peripheral exposure, such as an exposure amount, an exposure position or an exposure width is received by (input to) a first information input unit 9 from the outside. Information (distance information D) about a distance between the substrate W held by the substrate holder 1 and the exposure optical system 18 in the direction parallel to the optical axis of the exposure optical system 18 is received by (input to) a second information input unit 12 from the outside. A driving condition calculation unit 8 calculates the rotational speed of the rotary driving unit 2 at the time of the peripheral exposure based on the exposure amount obtained from the first information input unit 9. Further, the driving condition calculation unit 8 calculates the position in the X-axis direction of the substrate W at the time of the peripheral exposure based on the exposure position obtained from the first information input unit 9. The driving condition calculation unit 8 may calculate the position in the X-axis direction of the substrate W to adjust the deviation of the center position of the substrate W in the X-Y plane obtained by the detection using the detector 4. Further, the driving condition calculation unit 8 obtains an azimuth angle θ of the substrate W held by the substrate holder 1 W based on a reference position in an azimuth angle direction of the substrate W, such as a notch or an orientation flat detected by the detector 4. Furthermore, the driving condition calculation unit 8 calculates the position in the X-axis direction of the translational driving unit 3 based on the distance information D obtained from the second information input unit 12. The driving slit condition calculation unit 10 calculates an opening width set in the driving slit 6 based on the exposure width obtained from the first information input unit 9. An Xθ controller 7 drives the rotary driving unit 2 an amount of movement (driving amount) at which the substrate W is located at the position in the X-axis direction determined by the driving condition calculation unit 8. The driving slit opening width controller 11 drives the driving slit 6 to an opening width determined by the driving slit condition calculation unit 10.

Next, the operation of the exposure apparatus 100 will be described. The exposure unit 5 irradiates a part of the peripheral portion of the substrate W with the exposure light while the Xθ controller 7 rotates the rotary driving unit (rotation device) 2 at a desired rotational speed, and thus the exposure apparatus 100 can expose the entire peripheral portion of the substrate W at a set exposure position or a set exposure width. However, when the shape of the substrate W is not flat and especially when the peripheral portion is warped, or when the thickness is uneven, if the peripheral exposure is performed without taking any precautions, there is a possibility of the following inconvenience.

Figure 2A:
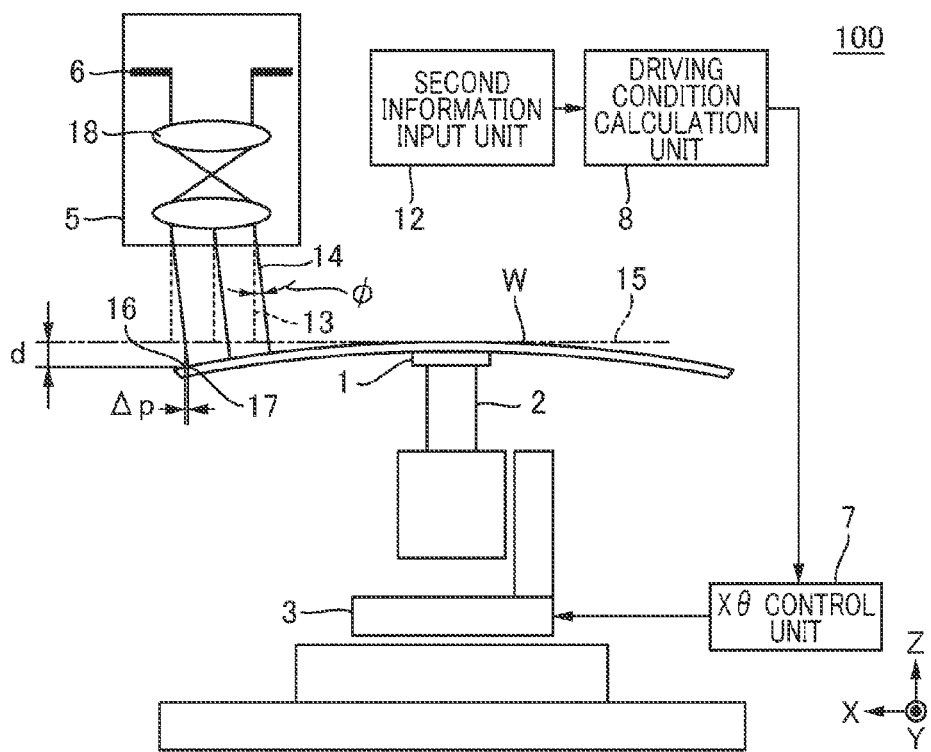
FIG. 2A is a diagram illustrating a state at the time of a peripheral exposure in the first embodiment.
Figure 2B:
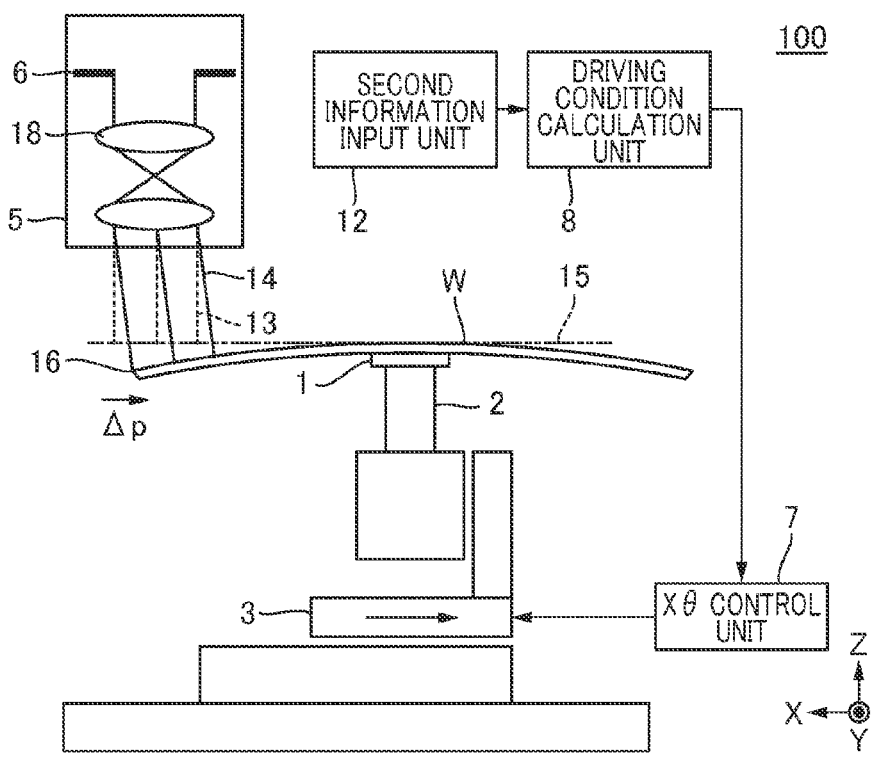
FIG. 2B is a diagram illustrating a state at the time of the peripheral exposure in the first embodiment.

FIGS. 2A and 2B are schematic cross-sectional views illustrating a state of the exposure apparatus 100 when the peripheral exposure of the substrate W is performed while a peripheral portion is warped toward a vertically lower side. FIG. 2A illustrates a state prior to offsetting the position of the substrate W. When the substrate W is warped, the exposed surface on the substrate W is defocused from an ideal imaging surface 15 illustrated by a two-dot chain line. A general peripheral exposure apparatus is designed so that the main light beam 13 of the exposure optical system is perpendicular to the ideal imaging surface 15, in other words, parallel to the optical axis of the exposure optical system. However, in practice, the main light beam of the exposure optical system is not perpendicular to the ideal imaging surface 15 due to manufacturing errors or assembly errors, and for example, as illustrated by the main light beam 14 in the drawings, the on-axis main light beam and the off-axis main light beam are inclined in the same direction. Therefore, when the peripheral exposure of the substrate W is performed while the main light beam is inclined without applying the present embodiment, the main light beam is exposed to a position 17 deviated by an amount Δp determined by the defocus amount and the amount of inclination of the main beam with respect to the ideal exposure position 16. Therefore, in this embodiment, the exposure apparatus 100 performs the peripheral exposure after adjusting the position of the substrate W (the exposure position relative to the substrate W), that is, after offsetting the position of the substrate W by the amount of deviation Δp of the exposure position as follows.

Figure 3:
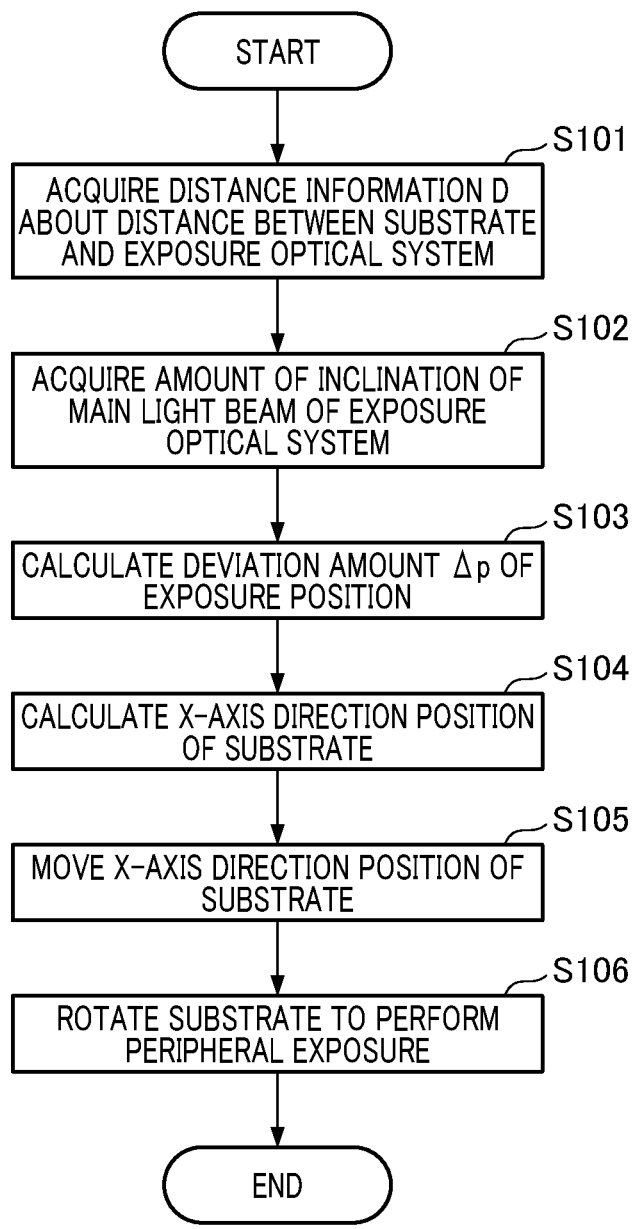
FIG. 3 is a flow chart illustrating the flow of the peripheral exposure in the first embodiment.

FIG. 3 is a flowchart illustrating the flow of the peripheral exposure in the present embodiment. First, the second information input unit 12 acquires distance information D about the distance between the substrate W held by the substrate holder 1 and the exposure optical system 18 (step S101). Here, the distance information D includes at least one of the warp amount and the thickness of the substrate W, and before the substrate W is held by the substrate holder 1, the information is measured in advance using a measuring device (measuring unit) (not illustrated). Further, the measuring device may be included or may not be included as a component of the exposure apparatus 100. For example, the measuring device configured to measure the distance between the substrate W held by the substrate holder 1 and the exposure optical system 18 may be installed inside the exposure apparatus 100, and the results measured by the measuring device may be directly input to the second information input unit 12. The measuring device can also be used in combination with the detector 4. With this configuration, for example, even when the substrate W held by the substrate holder 1 is deflected by gravity and the distance between the substrate W and the exposure optical system 18 changes, the second information input unit 12 can acquire as accurate distance information D as possible. The timing (timing of executing step S101) of acquiring the distance information D may be provided for each substrate W, may be provided for each lot including a plurality of substrates W, or may be provided for each process.

Next, the driving condition calculation unit 8 acquires the amount of inclination of the main light beam 14 of the exposure optical system 18 (step S102). Here, the amount of inclination of the main light beam 14 is an amount of inclination of the on-axis main beam or the off-axis main beam to the ideal main light beam 13 (the optical axis of the exposure optical system 18), and may be telecentricity. The telecentricity also includes an amount of inclination (an amount of spread) when there is spreading with respect to the optical axis of the exposure optical system 18, as in a main light beam 19 referred to in the following third embodiment, as well as the amount of inclination when the on-axis main light beam and the off-axis main light beam are inclined in parallel in the same direction. Moreover, the amount of inclination of the main light beam 14 is obtained in advance, for example, by performing the peripheral exposure of the substrates W having the different thicknesses, and by measuring a change in position of the peripheral exposure for each thickness of the substrate W using an inspecting device (inspection unit) (not illustrated).

Next, the driving condition calculation unit 8 calculates the amount of deviation $\Delta p$ of the exposure position based on the distance information D obtained in step S101 and the amount of inclination of the main light beam 14 of the exposure optical system 18 (step S103). Here, when an inclination angle of the main light beam 14 with respect to the ideal imaging surface 15 is defined as $\phi$ and an amount of deviation (defocus amount) of the position in the focusing direction (in this case, the Z-axis direction) of the substrate W from the ideal imaging surface 15 is defined as d, the amount of deviation $\Delta p$ of the exposure position is calculated according to the formula $\Delta p = d \times \tan \phi$.

Next, the driving condition calculation unit 8 further calculates the position in the X-axis direction of the substrate W to adjust the amount of deviation $\Delta p$ of the exposure position (step S104). Next, the X$\theta$ controller 7 drives the translational driving unit 3, and moves the rotary driving unit 2 to a position in the X-axis direction determined in step S104 (step S105). In this way, the movement of the rotary driving unit 2 only in the X-axis direction reduces the influence of telecentricity, and one positioned in the Y-axis direction in advance is assumed. In addition, the X-axis direction is an example, and it may be any direction in a radial direction of the substrate W.

Next, an exposure controller (not illustrated) irradiates the exposure unit 5 with the exposure light, while the X$\theta$ controller 7 drives the rotary driving unit 2 to rotate the substrate W on the substrate holder 1 at a desired rotational speed, thereby performing the peripheral exposure (step S106).

FIG. 2B illustrates a state when the peripheral exposure is performed the position of the substrate W offset by $\Delta p$. In this way, even when the substrate W is warped, by offsetting (offset amount $\Delta p$) the position of the substrate W, it is possible to perform the peripheral exposure at a desired position. In addition, as described above, the exposure apparatus 100 does not require a driving unit for moving the substrate W held by the substrate holder 1 in the focusing direction (Z-axis direction) when the position of the substrate W is offset. Therefore, the exposure apparatus 100 can have a simple configuration.

As described above, according to this embodiment, it is possible to provide an exposure apparatus that is advantageous for suppressing an occurrence of deviation of the exposure position in the peripheral portion of the substrate with a simple configuration.

Further, in the above description, although the peripheral portion of the substrate W is described as being warped downward as an example, the exposure apparatus 100 can also be applied to a case in which the peripheral portion of the substrate W is warped upward. Furthermore, as factors in which the position in the focusing direction of the surface to be exposed on the substrate W is deviated from the ideal imaging surface 15, since the thickness of the substrate W is also included without being limited to the warp of the substrate W, the exposure apparatus 100 is also applicable to the substrate W in which the thickness locally changes.

Second Embodiment

Next, an exposure apparatus according to a second embodiment of the present invention will be described. The exposure apparatus according to this embodiment is characterized in that the distance information $D(\theta)$ for each azimuth angle $\theta$ of the substrate W is provided instead of the distance information D in the first embodiment, and the peripheral exposure is performed while the offset amount $\Delta p(\theta)$ of the substrate W is changed according to the distance information $D(\theta)$ depending on the azimuth angle $\theta$.

Figure 4A:
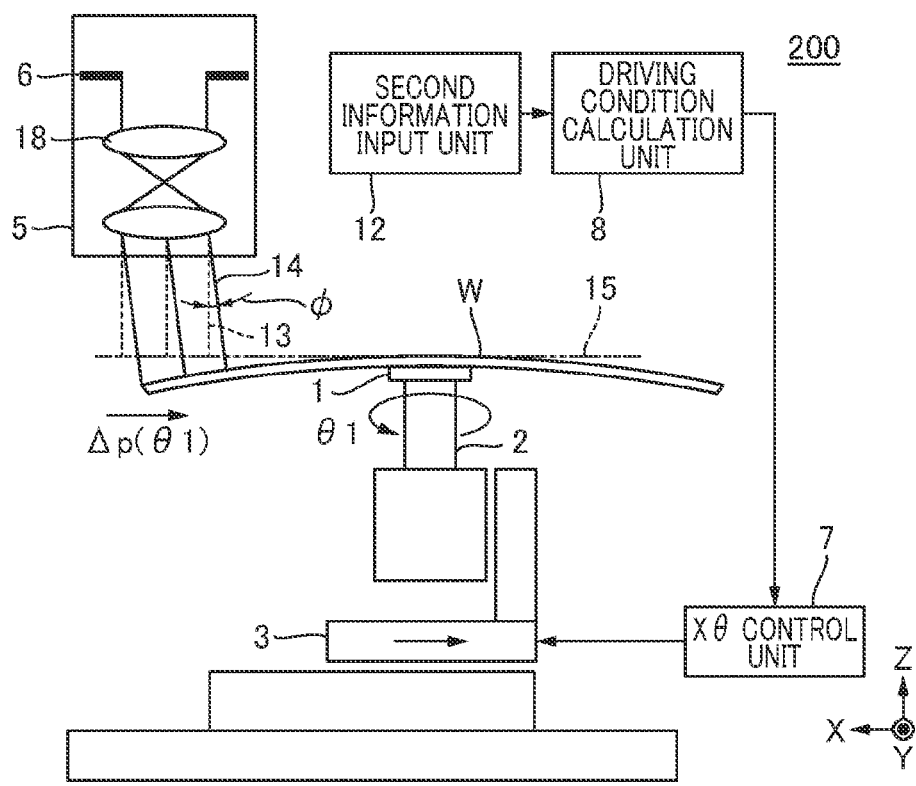
FIG. 4A is a diagram illustrating a configuration of an exposure apparatus according to a second embodiment.
Figure 4B:
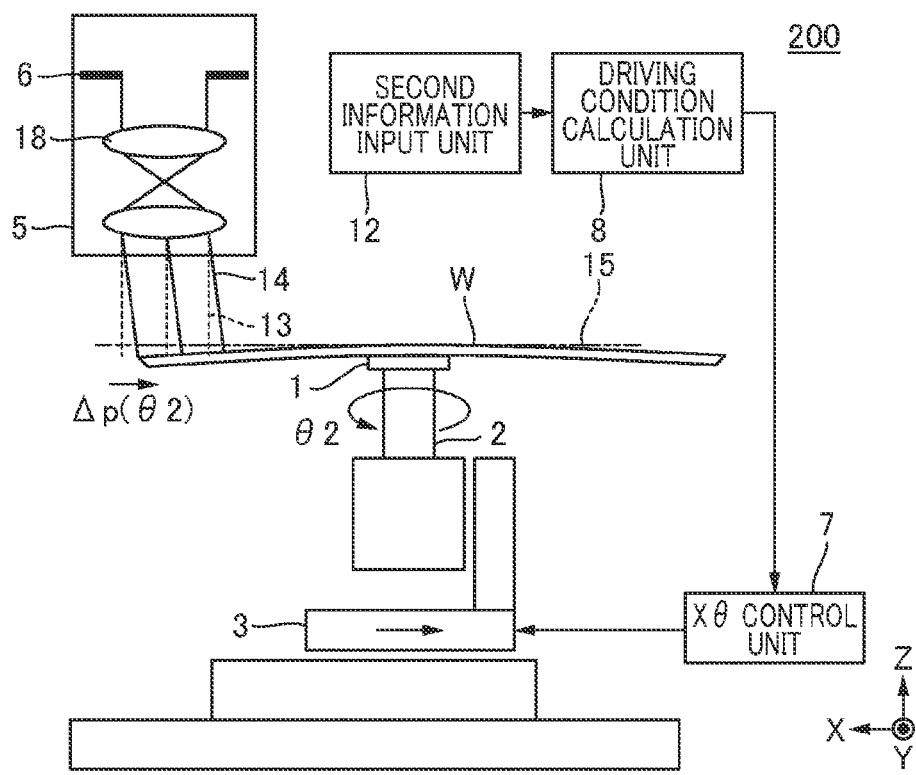
FIG. 4B is a diagram illustrating the configuration of the exposure apparatus according to the second embodiment.

FIGS. 4A and 4B are schematic cross-sectional views illustrating the configuration of the exposure apparatus 200 according to this embodiment, and a state of the exposure apparatus 200 when the peripheral exposure of the substrate W is performed while the peripheral portion is warped toward the vertically lower side. FIG. 4A illustrates a state when an azimuth angle of the substrate W is $\theta 1$, and the position of the substrate W is offset by $\Delta p(\theta 1)$ to perform the peripheral exposure. FIG. 4B illustrates a state when the azimuth angle of the substrate W is $\theta 2$, and the position of the substrate W is offset by $\Delta p(\theta 2)$ to perform the peripheral exposure. Further, in the exposure apparatus 200, the same configurations as those of the exposure apparatus 100 according to the first embodiment illustrated in FIGS. 1 and 2 are denoted by the same reference numerals, and the descriptions thereof will be omitted. Here, the warp amount of the substrate W at the azimuth angle $\theta 1$ is greater than that at the azimuth angle $\theta 2$. Therefore, the distance information $D(\theta 1)$ and the distance information $D(\theta 2)$ are different from each other, and the offset amount $\Delta p(\theta 1)$ of the substrate W becomes greater than the offset amount $\Delta p(\theta 2)$. Therefore, the exposure apparatus 200 performs the peripheral exposure, by offsetting the position of the substrate W in the case illustrated in FIG. 4A more significantly than in the case illustrated in FIG. 4B. In addition, in order to more accurately adjust the exposure position, it is desirable to obtain the offset amount $\Delta p(\theta)$ at a large number of azimuth angles $\theta$ and to offset the position of the substrate W by referring to them. However, in the case of the substrate W in which changes in the warp amount and the warping direction are small, a small number of azimuth angles $\theta$ may be referred to. For example, the offset amount $\Delta p(\theta)$ may be obtained for each azimuth angle $\theta = 0°$ and $180°$, and may be obtained for each azimuth angle $\theta = 0°$, $90°$, $180°$ and $270°$.

FIG. 5 is a flowchart illustrating the flow of the peripheral exposure in the present embodiment. First, the second information input unit 12 acquires distance information $D(\theta)$ about the distance between the substrate W held by the substrate holder 1 and the exposure optical system 18, for each azimuth angle $\theta$ of the substrate W (step S201). Next, the driving condition calculation unit 8 acquires the amount of inclination of the main light beam 14 of the exposure optical system 18 (step S202). Next, the driving condition calculation unit 8 calculates the amount of deviation $\Delta p (\Delta p = d \times \tan \phi)$ of the exposure position for each azimuth angle $\theta$ of the substrate W based on the distance information $D(\theta)$ obtained in step S201 and the amount of inclination of the main light beam 14 of the exposure optical system 18 (step S203). Next, the driving condition calculation unit 8 further calculates the position in the X-axis direction of the substrate W to adjust the amount of deviation $\Delta p$ of the exposure position for each azimuth angle $\theta$ of the substrate (step S204). Further, the X$\theta$ controller 7 rotates the substrate W at a desired rotational speed by driving the rotary driving unit 2, and at the same time, the peripheral exposure is performed while the translational driving unit 3 is driven to the position in the X-axis direction determined in step S204 for each azimuth angle $\theta$ of the substrate W (step S205).

In this way, according to this embodiment, since it is possible to optimize the position of the peripheral exposure for each azimuth angle θ of the substrate W, it is also possible to perform the peripheral exposure at a desired exposure position on a substrate W having a rotationally asymmetric warp shape in which the warp amount and the warping direction are not constant with respect to the azimuth angle θ.

Further, in the first and second embodiments described above, although the position of the substrate W was moved in the X-axis direction when the exposure position was adjusted, the means for adjusting the exposure position is not limited thereto. For example, the driving slit 6 may be moved in the X-axis direction while the opening width is maintained (in the case of the configuration in which the driving slit 6 includes a plurality of blades with which the opening width is variable, a constant interval is maintained between the plurality of blades).

Third Embodiment

Next, an exposure apparatus according to a third embodiment of the present invention will be described. The exposure apparatus according to this embodiment is characterized in that the peripheral exposure is performed after changing the opening width of the driving slit (adjustment unit) 6 depending on the distance information D referred to in the first embodiment.

Figure 6:
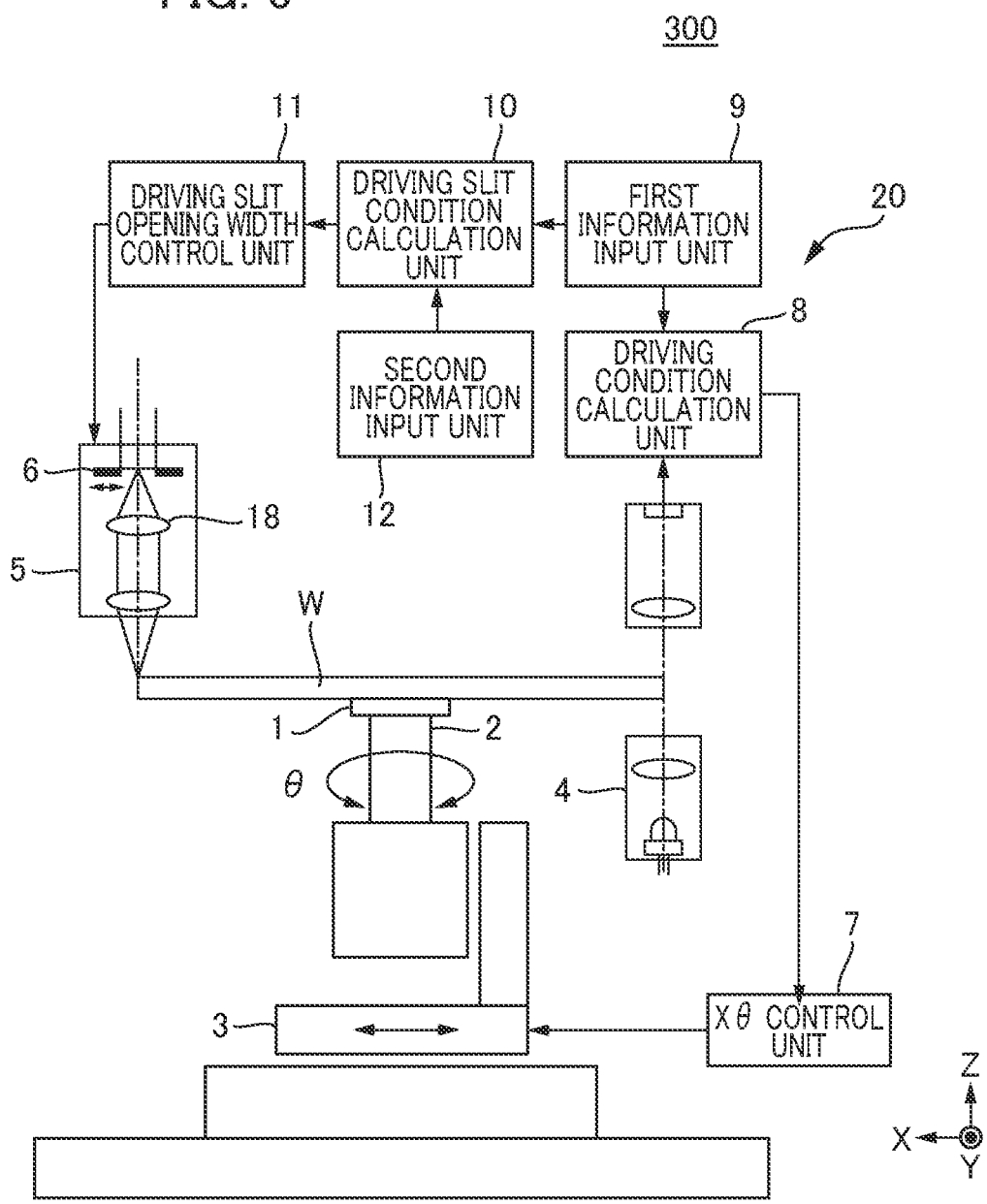
FIG. 6 is a diagram illustrating a configuration of an exposure apparatus according to a third embodiment.
Figure 7A:
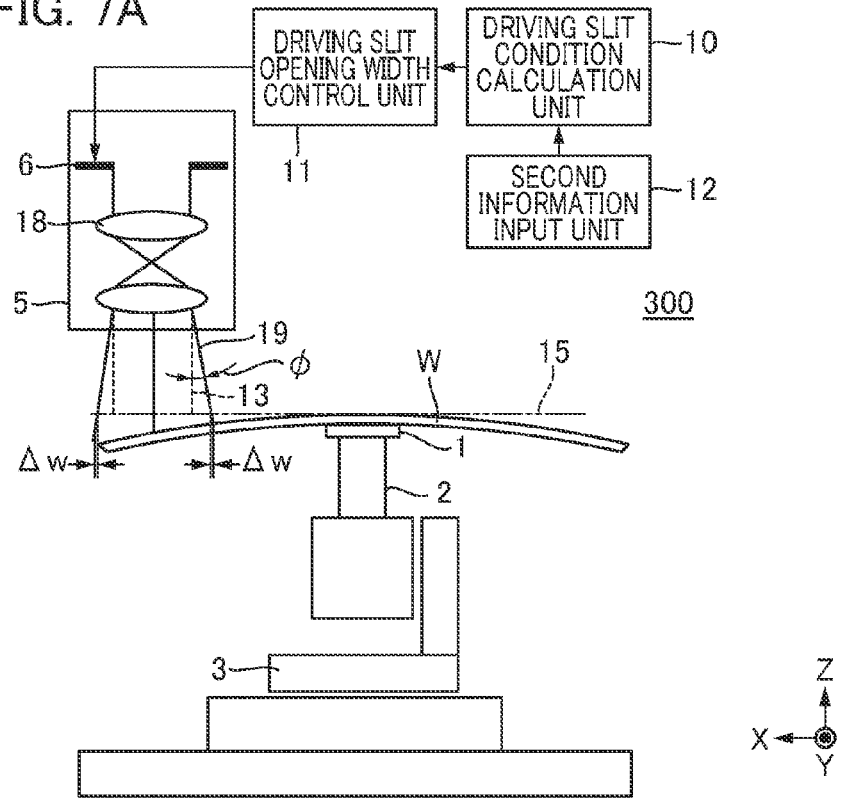
FIG. 7A is a diagram illustrating a state at the time of the peripheral exposure in the third embodiment.
Figure 7B:
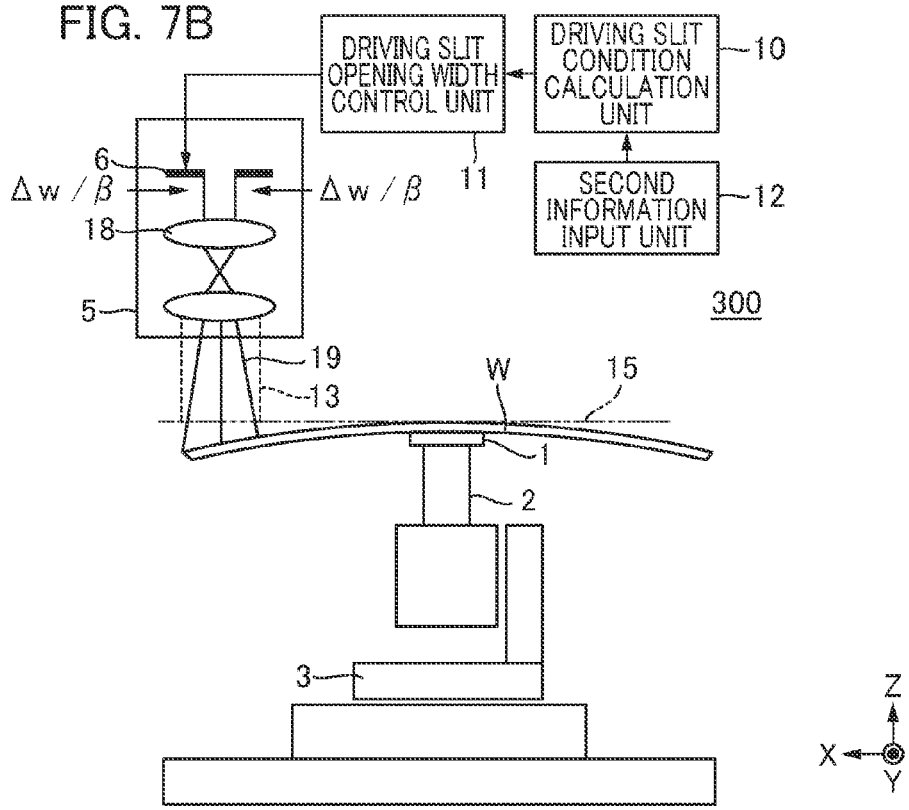
FIG. 7B is a diagram illustrating a state at the time of the peripheral exposure in the third embodiment.

FIG. 6 is a schematic cross-sectional view illustrating a configuration of an exposure apparatus 300 according to this embodiment. FIGS. 7A and 7B are schematic cross-sectional views illustrating a state of the exposure apparatus 300 when the peripheral exposing of the substrate W is performed while the peripheral portion is warped toward the vertically lower side. FIG. 7A illustrates a state before the offset of the opening width of the driving slit 6. FIG. 7B illustrates a state after the offset of the opening width of the driving slit 6. Further, in the exposure apparatus 300, the same configurations as those of the exposure apparatus 100 according to the first embodiment illustrated in FIGS. 1, 2A and 2B are denoted by the same reference numerals, and the description thereof will be omitted. The main light beam of the actual exposure optical system is not perpendicular to the ideal imaging surface 15, due to a manufacturing error or an assembly error as described above. In this state, for example, as in the main light beam 19 illustrated in FIG. 7A, since the off-axis main light beam is inclined, in other words, the exposure width of the peripheral exposure changes to spread with respect to the optical axis of the exposure optical system 18, the exposure is performed at a position deviated by Δw from a predetermined exposure position. Therefore, in this embodiment, the driving slit condition calculation unit 10 calculates the amount of deviation Δw of the exposure width based on the distance information D, and the driving slit opening width controller 11 controls the opening width of the driving slit 6 so that the exposure width on the surface of the substrate W is offset by Δw at the time of the peripheral exposure. In this case, the offset amount of the opening width of the driving slit 6 is (amount of deviation Δw of the exposure width on the surface of the substrate W)/(magnification β of the exposure optical system 18).

FIG. 8 is a flowchart illustrating the flow of the peripheral exposure in the present embodiment. First, step S301 is identical to step S101 of FIG. 3 in the first embodiment. Next, the driving condition calculation unit 8 acquires an amount of inclination (an amount of spread) of the main light beam 19 of the exposure optical system 18 (step S302).

Next, the driving slit condition calculation unit 10 calculates the amount of deviation Δw of the exposure width based on the distance information D obtained in step S301 and the amount of inclination of the main light beam 19 of the exposure optical system 18 (step S303). Here, when the inclination angle of the main light beam 19 to the ideal imaging surface 15 is defined as φ and the amount of deviation of the position in the focusing direction (in this case, the Z-axis direction) of the substrate W from the ideal imaging surface 15 is defined as d, the amount of deviation Δw of the exposure width is calculated according to the formula Δw=d×tan φ×2. Next, the driving slit condition calculation unit 10 calculates the opening width to adjust the amount of deviation Δw of the exposure width (step S304). Next, the driving slit opening width controller 11 drives the driving slit 6 to an opening width determined in step S304 (step S305). Further, while the Xθ controller 7 drives the rotary driving unit 2 to rotate the substrate W on the substrate holder 1 at a desired rotational speed, the peripheral exposure is performed (step S306).

In this way, according to the present embodiment, even by changing the opening width of the driving slit 6 depending on the distance information D, it is possible to perform the peripheral exposure at a desired position as illustrated in FIG. 7B, and consequently, the same effects as in the first embodiment can be exhibited.

Further, in the above description, although a means of changing the opening width of the driving slit 6 is adopted as the means for adjusting the exposure width, for example, a means of changing the magnification β of the exposure optical system 18 by moving a part of the optical element constituting the exposure optical system 18 in the optical axis direction may be adopted. Also, in this embodiment, similarly to the second embodiment, an amount of deviation Δw(θ) may be determined for each azimuth angle θ of the substrate W, and the peripheral exposure may be performed with the opening width Δw(θ)/β of the driving slit 6 offset.

Fourth Embodiment

Next, an exposure apparatus according to a fourth embodiment of the present invention will be described. The exposure apparatus according to this embodiment is characterized in that the opening width of the driving slit (adjustment unit) 6 is more complexly changed depending on the distance information D to improve upon the third embodiment.

Figure 9:
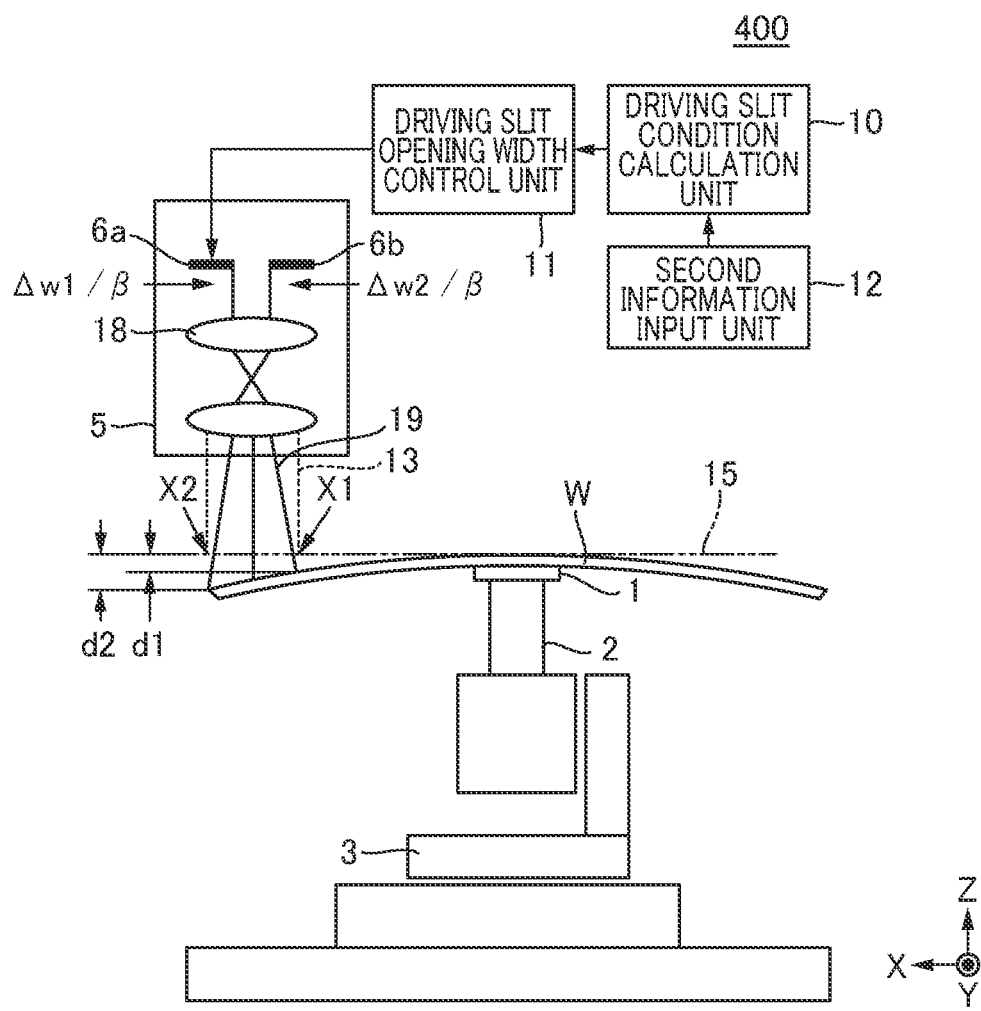
FIG. 9 is a diagram illustrating a configuration of an exposure apparatus according to a fourth embodiment.

FIG. 9 is a schematic cross-sectional view illustrating a configuration of an exposure apparatus 400 of the present embodiment, and a state of the exposure apparatus 400 when the peripheral exposure of the substrate W is performed while the peripheral portion is warped toward the vertically lower side. Further, in the exposure apparatus 400, the same configurations as those of the exposure apparatus 100 according to the first embodiment illustrated FIGS. 1, 2A and FIG. 2B are denoted by the same reference numerals, and the description thereof will be omitted. Here, when the substrate W is warped, since the amount of defocus d1 in the radial position X1 of the substrate W is different from the amount of defocus d2 in the radial position X2 of the substrate W, the amount of deviation Δw1 of the exposure position at the position X1 is different from the amount of deviation Δw2 of the exposure position at the position X2. Therefore, in this embodiment, the driving slit 6, for example, includes a plurality (two in this embodiment) of blades 6a and 6b that form an opening interposed from both sides in the X-axis direction and are movable by different amounts of movement (amounts of drive) from each other by driving of the driving unit. Further, the exposure apparatus 300 determines each of the offset amount ($\Delta w1/\beta$) of the blade 6a and the offset amount ($\Delta w2/\beta$) of the blade 6b, and suitably changes the amount of offset for each of the blades 6a and 6b to perform the peripheral exposure.

Figure 10:
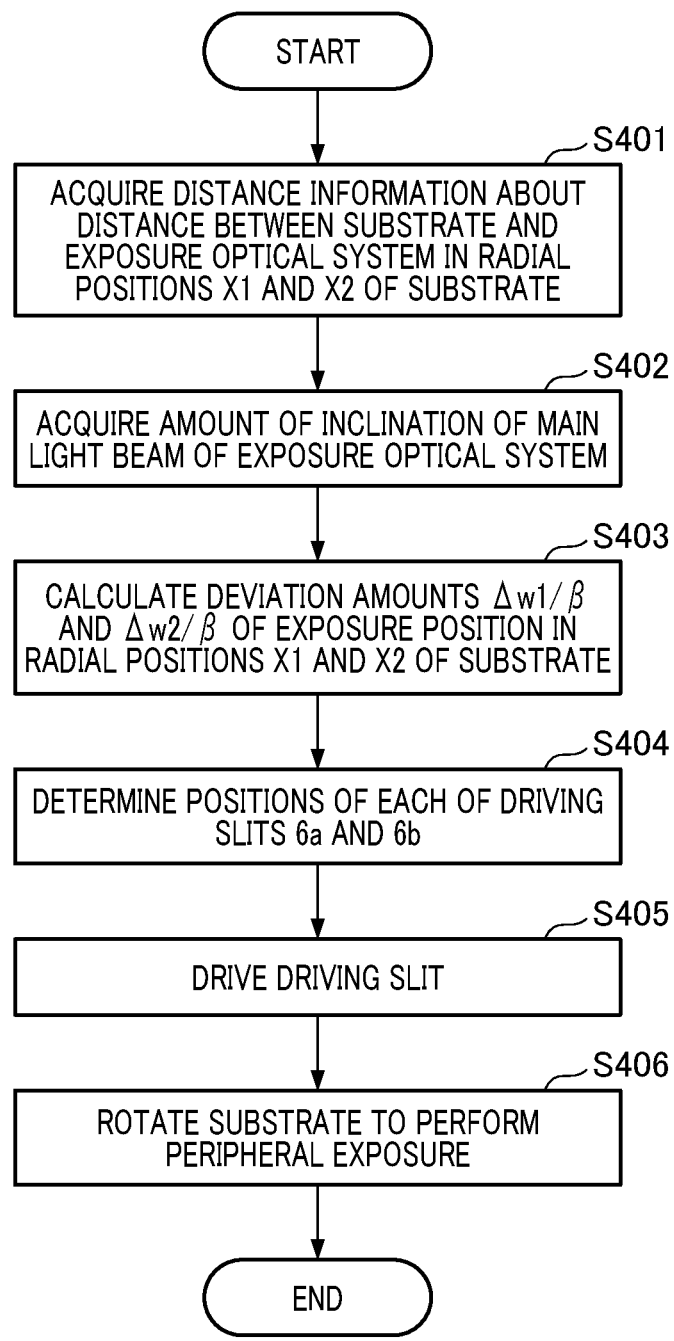
FIG. 10 is a flowchart illustrating the flow of the peripheral exposure in the fourth embodiment.

FIG. 10 is a flowchart illustrating the flow of the peripheral exposure in the present embodiment. First, the second information input unit 12 acquires the distance information D about the distance in the radial distances X1 and X2 of the substrate W between the substrate W held by the substrate holder 1 and the exposure optical system 18 (step S401). Next, the driving condition calculation unit 8 acquires an amount of inclination of the main light beam 19 of the exposure optical system 18 (step S402). Next, the driving slit condition calculation unit 10 calculates an amount of deviation $\Delta w1$ of the exposure position at the position X1 and an amount of deviation $\Delta w2$ of the exposure position at the position X2 based on the distance information D obtained in step S401 and the amount of inclination of the main light beam 19 of the exposure optical system 18 (step S403). Further, herein, the amount of deviation $\Delta w$ of the exposure position is calculated according to the formula of $\Delta w = d \times \tan \phi$. Next, the driving slit condition calculation unit 10 calculates the positions of the respective blades 6a and 6b to adjust the amount of deviation $\Delta w$ of the exposure position (step S404). Next, the driving slit opening width controller 11 drives the respective blades 6a and 6b to the positions calculated in step S404 (step S405). Further, while the X$\theta$ controller 7 drives the rotary driving unit 2 to rotate the substrate W on the substrate holder 1 at a desired rotation speed, the peripheral exposure is performed (step S406).

In this way, according to the present embodiment, while exhibiting the same effect as the first embodiment, in particular, even when the substrate W has a shape in which an amount of defocus differs depending on the radial position, it is possible to further optimize the exposure position.

Other Embodiments

In the above-described embodiments, in order to more accurately calculate each offset amount, the distance information D including the warp amount and the thickness of the substrate W is set as values obtained by the actual measurement. In contrast, from the viewpoint of further simplification of the apparatus configuration, and an improvement in productivity due to omission of the measurement time, there may be a configuration that does not use a measurer configured to measure the value included in the distance information D. For example, in place of the measured value, the distance information D that is acquired by the second information input unit 12 in step S101 or the like and is used in the subsequent process may be classified into a plurality of degrees between the substrate W and the exposure optical system 18 depending on the magnitude. As the degrees, for example, there is a warp amount of the substrate W that can be recognized in advance due to the process, and this can be classified into several degrees such as "large," "medium" and "small." If the degree is "large," the driving condition calculation unit 8 and the driving slit condition calculation unit 10 may determine the offset amount depending on the degree of "large" and may offset the substrate holder 1 and the driving slit 6.

Further, in the above-described embodiments, the offset amounts of the exposure position or the exposure width were determined to adjust the deviation of the exposure position due to the amount of defocus (warp amount or the like) of the substrate W and the amount of inclination (telecentricity) of the main light beam. However, the offset amount is not limited to this determination method, and for example, it may be determined in consideration of a blurring width of a boundary of the exposure region due to defocus. Here, the blurring width refers to a radial width of a blurred region that is generated at the boundary between an irradiation region of the exposure light and a non-irradiation region of the exposure light by the defocus. Since the illuminance is low in the blurred region, a desired amount of exposure is performed only in a region of a position shifted by a half distance of the blurring width with respect to a desired exposure position, and the resist remaining is also considered at the time of development after exposure. Therefore, in order to prevent the resist from remaining, it is desirable to determine the offset amount so that the exposure position changes by a half distance of the blurring width in advance. More specifically, since the number of openings NA of the exposure optical system 18 is determined according to the design value, when the deviation of the exposure position is adjusted, the driving condition calculation unit 8 acquires the number of openings NA of the exposure optical system 18 stored in a memory or the like in advance. Here, the blurring width W is a value obtained by multiplying the amount of defocus d and the number of openings NA of the exposure optical system 18, that is, the blurring width W can be calculated according to the formula W=d×NA. Further, in the subsequent peripheral exposure, after the position of the X-axis direction of the substrate W is changed by a distance of half the blurring width W, illuminance (amount of exposure) increases to an extent at which no resist remains in the blurred region. Thus, the exposure apparatus 100 or the like according to the above-described embodiments can perform the peripheral exposure at a desired exposure position, even if a boundary of the exposure region is blurred.

(Exposure System)

Figure 11:
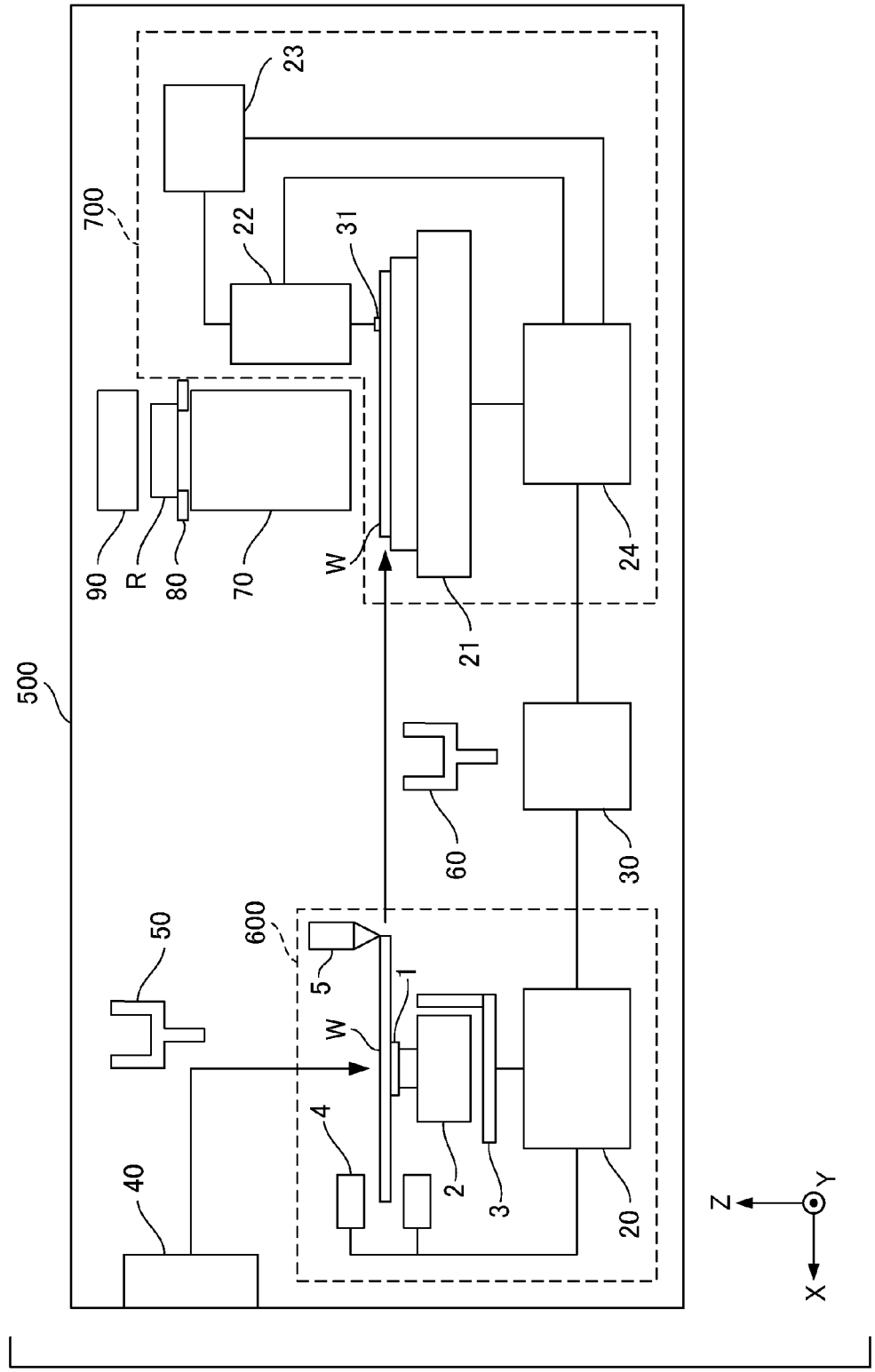
FIG. 11 is a diagram illustrating a configuration of an exposure system according to an embodiment.

Next, a configuration of an exposure system according to an embodiment of the present invention will be described. FIG. 11 is a schematic diagram illustrating a configuration of an exposure system 500 according to this embodiment. The exposure system 500, for example, is used in a lithography process in the manufacturing process of the semiconductor device, and is a projection exposure apparatus that exposes (transfers) an image of a pattern formed on an original R onto the substrate W (on the substrate) in a step-and-repeat method.

The exposure system 500 includes an illumination system 90, an original stage 80, a projection optical system 70 and a substrate stage 21. The illumination system 90 adjusts the light emitted from a light source (not illustrated) to illuminate the original (reticle) R. The original (reticle) R is, for example, made of quartz glass, and is formed with a pattern (e.g., a circuit pattern) to be transferred onto the substrate W. The original stage 80 holds the original R and is movable in each of the X- and Y-axis directions. The projection optical system 70 projects the light passing through the original R onto the substrate W at a predetermined magnification (e.g., ½). The substrate stage 21 holds the substrate and is movable in each of the W and X-, Y- and Z-axis directions.

Further, the exposure system 500 includes two types of alignment units including a first alignment unit 600 and a second alignment unit 700. Furthermore, the exposure system 500 includes a first carrying mechanism 50 which carries the substrate W from an interface 40, such as a line or a FOUP, to the first alignment unit 600, and a second carrying mechanism 60 that carries the substrate W from the first alignment unit 600 to the second alignment unit 700.

The first alignment unit 600 performs so-called pre-alignment of aligning the position of the substrate W to a desired position with precision that is coarser than precision of the positioning (alignment) performed by the second alignment unit 700. In particular, in this embodiment, an exposure apparatus (a peripheral exposure apparatus) according to the above-described embodiments can be applied to the first alignment unit 600. In this case, the first alignment unit 600 includes a control system 20 as a first controller including an image processing unit, a rotary driving unit 2 and a translational driving unit 3 as the first driving unit, a detector 4 as a first detection unit, and an exposure unit 5. Here, in the first alignment unit 600 as the positioning means, the control system 20 causes the detector 4 to detect the shape of the substrate W, performs the image processing on the detection result, and causes the rotary driving unit 2 and the translational driving unit 3 to appropriately change the attitude of the substrate W based on the image processing result to a desired position.

The second alignment unit 700 performs the alignment that matches an irradiation region irradiated with the exposure light emitted from the projection optical system 70, and a pattern region (a shot region) set on the substrate W in advance. Specifically, the second alignment unit 700 detects and matches marks (alignment marks) 31 formed on the substrate W in advance with precision finer than the positioning precision of the first alignment unit 600. The second alignment unit 700 includes a second controller 24, a second detection unit 22 and an image processing unit 23, in addition to the substrate stage 21 as the second driving unit. The second detection unit 22 is, for example, an alignment scope which detects the marks 31. The second controller 24 causes the second detection unit 22 to detect the marks 31, causes the image processing unit 23 to perform the image-processing on the detection result, and causes the substrate stage 21 to appropriately change the position of the substrate W based on the image processing result to a desired position.

Furthermore, the exposure system 500 has a controller 30. The controller 30, for example, is constituted by a computer or the like, is connected to each component of the exposure system 500 via a line, and can control the operation and the adjustment of each component according to a program or the like. In particular, the controller 30 is electrically connected to each of the control system 20 and the second controller 24 via communication lines, controls the operation of the first alignment unit 600 and the second alignment unit 700, and receives each detection result. The controller 30 may be configured integrally with other parts of the exposure system 500 (within a common casing), and may be configured separately from other parts of the exposure system 500 (within a separate casing).

The exposure system 500 performs positioning twice with the first alignment unit 600 and the second alignment unit 700 before the exposure is initiated. First, the first carrying mechanism 50 carries the substrate W carried in from the interface 40 to the first alignment unit 600, and the first alignment unit 600 performs the pre-alignment of the wafer W as a target. Next, the second carrying mechanism 60 carries the substrate W, on which the pre-alignment is completed by the first alignment unit 600, to the substrate stage 21 as a component of the second alignment unit 700. Next, the second alignment unit 700 performs the alignment of the wafer W as a target. Further, the exposure system 500 performs the pattern exposure on the substrate W on which the alignment is completed.

According to such an exposure system 500, since the exposure apparatuses according to the above-described embodiments are applied to the first alignment unit 600, first, the entire system can have a simple configuration. Further, according to the exposure system 500, in the first alignment unit 600, since the occurrence of deviation of the exposure position in the peripheral portion of the substrate W is suppressed and the peripheral exposure can be accurately performed, it is possible to suppress undesirable effects on the patterns formed on the substrate W.

(Device Manufacturing Method)

A method of manufacturing devices according to an embodiment of the present invention is suitable for manufacturing an article such as a microdevice (for example, a liquid crystal display device) or an element having a microstructure. This manufacturing method can include a step of forming a latent image pattern on a photosensitive agent of a substrate onto which the photosensitive agent is applied by using the above-described exposure system (step of exposing on the substrate), and a step of developing the substrate on which the latent image pattern is formed. Further, this manufacturing method includes other well-known steps (for example, oxidization, deposition, vapor deposition, doping, planarization, etching, resist removal, dicing, bonding, packaging and the like). The method of manufacturing devices according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-007122 filed Jan. 16, 2015, which is hereby incorporated by reference herein in its entirety.

What is claimed is:

1. An exposure apparatus that exposes a peripheral portion of a substrate to light, the apparatus comprising:
    an optical system configured to expose the substrate to the light with respect to an exposure position of the substrate;
    a stage configured to hold the substrate and be moved in a direction perpendicular to an optical axis of the optical system to position the substrate in the direction; and
    a controller configured to cause the stage to be moved in the direction,
    wherein the controller is configured to cause the stage to be moved in the direction by an amount of deviation, of the exposure position from an ideal exposure position thereof, obtained based on information about a distance between the optical system and the peripheral portion in a direction parallel to the optical axis and a telecentricity of the optical system so that a predetermined peripheral portion of the substrate is exposed to the light from the optical system.

2. The exposure apparatus according to claim 1, wherein the controller is configured to obtain the amount based on information about the distance which changes with an azimuth angle defined on the substrate.

3. The exposure apparatus according to claim 1, further comprising a measuring device configured to measure the distance.

4. The exposure apparatus according to claim 1, wherein the information about the distance includes a warp amount or a thickness of the substrate or both thereof.

5. The exposure apparatus according to claim 1, wherein the information about the distance includes one of a plurality of degrees each of which represents a degree of the distance.

6. The exposure apparatus according to claim 1, wherein the telecentricity is an amount of inclination of an on-axis principal ray of the light relative to the optical axis.

7. The exposure apparatus according to claim 1, wherein the telecentricity is an amount of inclination of an off-axis principal ray of the light relative to the optical axis.

8. The exposure apparatus according to claim 1, wherein the controller is configured to cause the stage to be moved further based on a numerical aperture of the optical system.

9. The exposure apparatus according to claim 1, further comprising a rotation device configured to rotate the stage, and
wherein the controller is configured to cause the rotation device to rotate the stage to expose the peripheral portion to the light while the substrate is rotated.

10. The exposure apparatus according to claim 1, further comprising:
an exposure device configured to expose the substrate to light via an original to form a pattern on the substrate.

11. An exposure apparatus that exposes a peripheral portion of a substrate to light, the apparatus comprising:
an optical system including a field stop and configured to expose the substrate to the light with respect to an exposure position of the substrate in a field of view determined via the field stop;
a driving device configured to move a member of the field stop to change the field of view; and
a controller configured to control the driving device,
wherein the controller is configured to cause the driving device to move the member, to change the field of view based on an amount of deviation, of the exposure position from an ideal position thereof, obtained based on information about a distance between the optical system and the peripheral portion in a direction parallel to an optical axis of the optical system and a telecentricity of the optical system so that a predetermined peripheral portion of the substrate is exposed to the light from the optical system.

12. The exposure apparatus according to claim 11, wherein the member includes two blades, and
the controller is configured to cause the driving device to move the member so that an interval of the two blades is constant.

13. The exposure apparatus according to claim 11, wherein the member includes two blades, and
the controller is configured to cause the driving device to move the member so that moving amounts of the two blades are different from each other.

14. The exposure apparatus according to claim 11, further comprising:
an exposure device configured to expose the substrate to light via an original to form a pattern on the substrate.

15. A method of manufacturing a device, the method comprising steps of:
exposing a substrate to light using an exposure apparatus;
developing the exposed substrate; and
processing the developed substrate to manufacture the device,
wherein the exposure apparatus exposes a peripheral portion of the substrate to light, and includes:
an optical system configured to expose the substrate to the light with respect to an exposure position of the substrate;
a stage configured to hold the substrate and be moved in a direction perpendicular to an optical axis of the optical system to position the substrate in the direction; and
a controller configured to cause the stage to be moved in the direction,
wherein the controller is configured to cause the stage to be moved in the direction by an amount of deviation, of the exposure position from a predetermined peripheral portion of the substrate, obtained based on information about a distance between the optical system and the peripheral portion in a direction parallel to the optical axis and a telecentricity of the optical system so that the predetermined peripheral portion is exposed to the light from the optical system.

16. A method of manufacturing a device, the method comprising steps of:
exposing a substrate to light using an exposure apparatus;
developing the exposed substrate; and
processing the developed substrate to manufacture the device,
wherein the exposure apparatus exposes a peripheral portion of the substrate to light, and includes:
an optical system including a field stop and configured to expose the substrate to the light in a field of view determined via the field stop;
a driving device configured to move a member of the field stop to change the field of view; and
a controller configured to control the driving device,
wherein the controller is configured to cause the driving device to move the member, to change the field of view based on an amount of deviation, of the exposure position from a predetermined peripheral portion of the substrate, obtained based on information about a distance between the optical system and the peripheral portion in a direction parallel to an optical axis of the optical system and a telecentricity of the optical system so that the predetermined peripheral portion is exposed to the light from the optical system.

17. An exposure apparatus that exposes a peripheral portion of a substrate to light, the apparatus comprising:
an optical system configured to expose the substrate to the light with respect to an exposure position of the substrate;
wherein the apparatus is configured to adjust the exposure position in a direction perpendicular to an optical axis of the optical system based on an amount of deviation, of the exposure position from an ideal exposure position thereof, obtained based on information about a distance between the optical system and the peripheral portion in a direction parallel to the optical axis and a telecentricity of the optical system so that a predetermined peripheral portion of the substrate is exposed to the light from the optical system.

18. The exposure apparatus according to claim 17, further comprising a stage configured to hold the substrate and to be rotated to rotate the substrate,
wherein the apparatus is configured to expose the peripheral portion to light with the substrate being rotated with the stage.

19. The exposure apparatus according to claim 18, wherein the apparatus is configured to adjust the exposure position in a radial direction of the substrate.

20. A method of manufacturing a device, the method comprising steps of:
exposing a substrate to light using an exposure apparatus;
developing the exposed substrate; and processing the developed substrate to manufacture the device, wherein the exposure apparatus exposes a peripheral portion of the substrate to light, and includes:

an optical system configured to expose the substrate to the light with respect to an exposure position of the substrate;

wherein the apparatus is configured to adjust the exposure position based on an amount of deviation, of the exposure position from an ideal exposure position thereof, obtained based on information about a distance between the optical system and the peripheral portion in a direction parallel to the optical axis and a telecentricity of the optical system so that a predetermined peripheral portion of the substrate is exposed to the light from the optical system.

* * * * *